US010522284B2

(12) United States Patent
Mori et al.

(10) Patent No.: US 10,522,284 B2
(45) Date of Patent: Dec. 31, 2019

(54) COIL FIXING STRUCTURE (71) Applicant: Nidec Seimitsu Corporation, Jeda-shi, Nagano-ken (JP)

(72) Inventors: Zendi Mori, Ueda (JP); Mitsuru Murata, Ueda (JP)

(73) Assignee: NIDEC SEIMITSU CORPORATION, Nagano (JP)

( * ) Notice: Subject to any disclaimer, the term of this patent is extended or adjusted under 35 U.S.C. 154(b) by 126 days.

(21) Appl. No.: 15/921,703

(22) Filed: Mar. 15, 2018

(65) Prior Publication Data

US 2018/0286570 A1 Oct. 4, 2018

(30) Foreign Application Priority Data

Mar. 30, 2017 (JP) ................. 2017-068792

(51) Int. Cl.
| H01F 27/28 | (2006.01) |
| H01F 27/29 | (2006.01) |
| H05K 1/18 | (2006.01) |
| H02K 35/02 | (2006.01) |
| H02K 3/04 | (2006.01) |
| H05K 1/11 | (2006.01) |

(52) U.S. Cl.
CPC .......... *H01F 27/292* (2013.01); *H01F 27/28* (2013.01); *H02K 3/04* (2013.01); *H02K 35/02* (2013.01); *H05K 1/11* (2013.01); *H05K 1/181* (2013.01); *H05K 2201/1003* (2013.01)

(58) Field of Classification Search
CPC ....... H01F 27/00–36; H02K 7/05; H02K 5/00

USPC ...... 336/65, 107, 192, 200, 232; 310/12, 15, 310/81, 89
See application file for complete search history.

(56) References Cited

U.S. PATENT DOCUMENTS

| 8,274,187 | B2 * | 9/2012 | Kim | ................. | H02K 7/063 310/51 |
| 8,860,264 | B2 * | 10/2014 | Kim | ................. | H02K 33/18 310/25 |
| 2006/0001324 | A1 * | 1/2006 | Won | ................. | B06B 1/045 310/81 |
| 2011/0062801 | A1 | 3/2011 | Choi et al. | | |
| 2011/0193426 | A1 * | 8/2011 | Chung | ................. | B06B 1/045 310/25 |
| 2011/0273257 | A1 * | 11/2011 | Ishizawa | ................. | H01F 17/043 336/192 |

* cited by examiner

*Primary Examiner* — Tuyen T Nguyen
(74) *Attorney, Agent, or Firm* — Keating & Bennett, LLP (57) ABSTRACT

A coil fixing structure includes a substrate, which has a thickness in a vertical direction, and a coil, which is wound around an axis extending in a vertical direction and fixed to the substrate. The substrate includes a conductor portion and an insulating portion disposed on the conductor portion. The conductor portion includes a first land portion and a second land portion, which are exposed from an upper surface of the substrate. A first lead wire drawn from the coil has an end portion connected to the first land portion. A second lead wire drawn from the coil has an end portion connected to the second land portion. When viewed in a plan in the vertical direction, the first land portion and the second land portion are disposed to surround the coil.

6 Claims, 11 Drawing Sheets

Fig.11

COIL FIXING STRUCTURE

CROSS REFERENCE TO RELATED APPLICATIONS

This application claims the benefit of priority to Japanese Patent Application No. 2017-068792 filed on Mar. 30, 2017. The entire contents of this application are hereby incorporated herein by reference.

BACKGROUND OF THE INVENTION

1. Field of the Invention

The present invention relates to a coil fixing structure.

2. Description of the Related Art

Various types of existing devices including smartphones include vibration motors. Vibration motors include a type that linearly vibrates in the horizontal direction and a type that linearly vibrates in the vertical direction. Human users sense vertical vibration more easily than horizontal vibration. U.S. Patent Application Publication No. 2011/0062801 discloses an example of an existing vibrating motor that linearly vibrates in the vertical direction.

The vibrating motor disclosed in U.S. Patent Application Publication No. 2011/0062801 includes a substrate and a coil. Two land portions are disposed on one surface of the substrate for electrical connection. The coil is disposed on the surface of the substrate. A coil proximal portion drawn from the coil is electrically connected to one of the land portions, and a coil distal portion drawn from the coil is electrically connected to the other land portion.

During manufacturing of the above vibration motor, the positions at which the two lead wires drawn from the coil may vary. In U.S. Patent Application Publication No. 2011/0062801, the land portions are located at a limited area. While the vibrating motor is manufactured, the coil needs to have its position adjusted depending on the positions of the lead wires drawn from the coil for the lead wires and the land portions to be electrically connected to each other. This position adjustment may reduce the manufacturing efficiency. Depending on the positions of the lead wires, the lead wires may fail to be connected to the respective land portions even with any position adjustment of the coil.

SUMMARY OF THE INVENTION

In an exemplary embodiment of the present invention, a coil fixing structure includes a substrate, which has a thickness in a vertical direction, and a coil, which is wound around an axis extending in a vertical direction and fixed to the substrate. The substrate includes a conductor portion and an insulating portion disposed on the conductor portion. The conductor portion includes a first land portion and a second land portion, which are exposed from an upper surface of the substrate. A first lead wire drawn from the coil has an end portion connected to the first land portion. A second lead wire drawn from the coil has an end portion connected to the second land portion. When viewed in a plan in the vertical direction, the first land portion and the second land portion are disposed to surround the coil.

According to an exemplary embodiment of the present disclosure, a coil fixing structure is efficiently manufactured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 2:
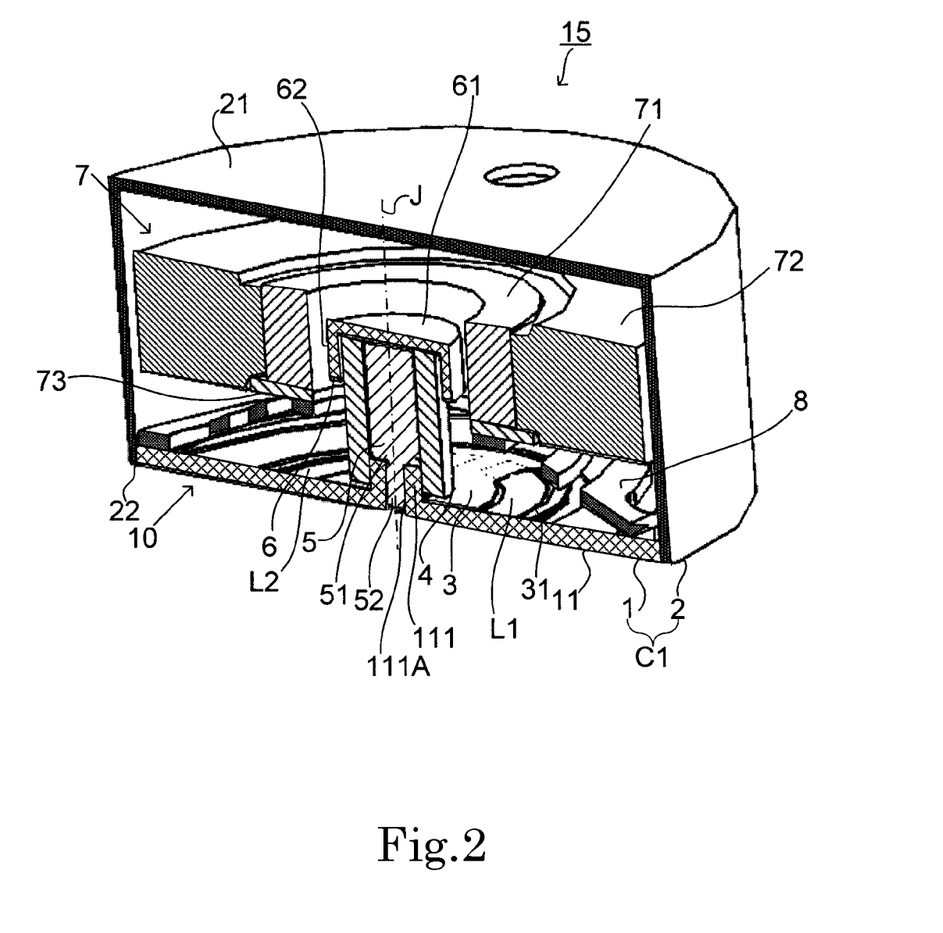
FIG. 2 is a sectional perspective view of the vibrating motor taken along line A-A in FIG. 1.

Exemplary embodiments of the present invention are described below with reference to the drawings. The direction in which a center axis J of a vibrating motor extends is referred to as "a vertical direction". For example, an upper side in FIG. 2 is referred to as the upper side in the vertical direction. A radial direction with respect to a center axis J is simply referred to as "a radial direction", and a circumferential direction with respect to the center axis J is simply referred to as "a circumferential direction". The "vertical direction" above does not express the positional relationship or the direction when the vibrating motor is installed in an actual device.

Figure 1:
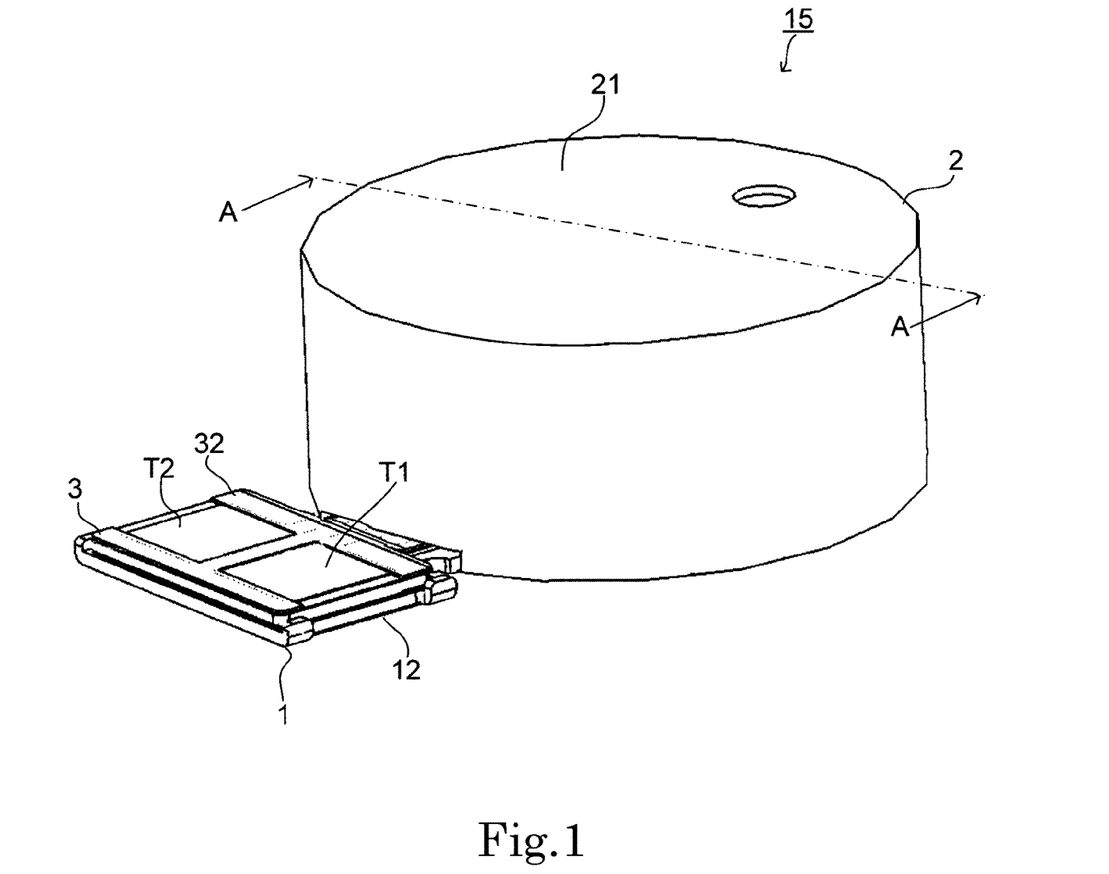
FIG. 1 is a perspective view of the appearance of a vibrating motor according to an embodiment of the present invention.
Figure 3:
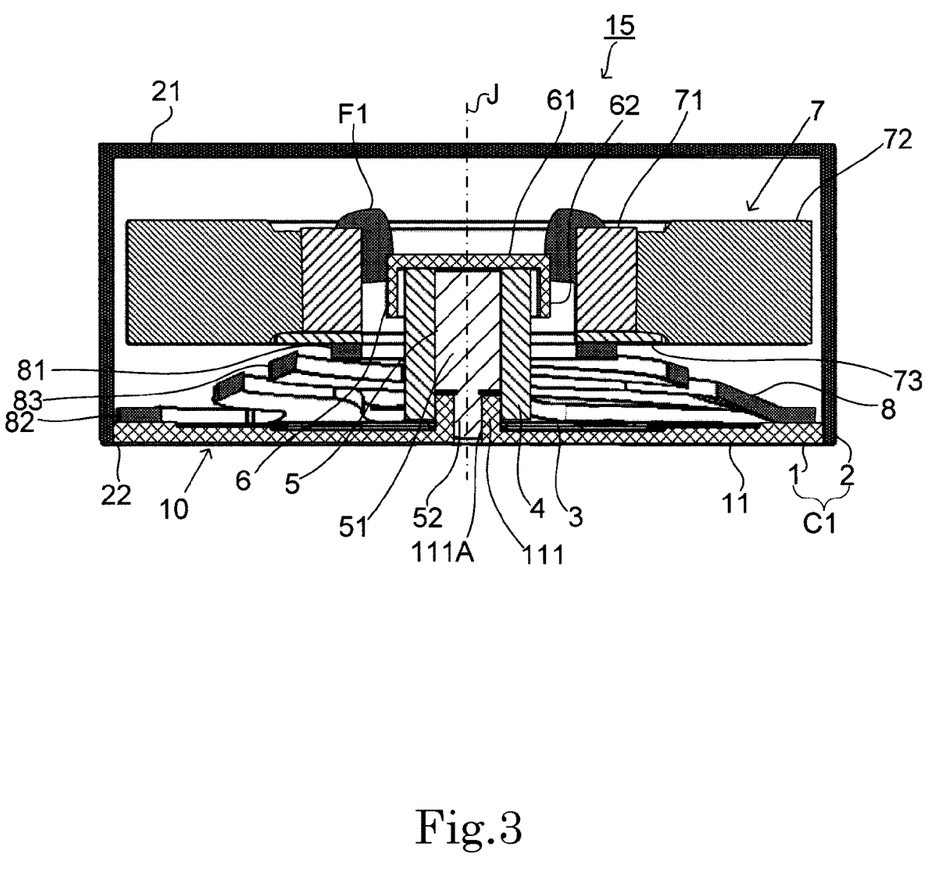
FIG. 3 is a sectional view of the vibrating motor taken along line A-A in FIG. 1.

FIG. 1 is a perspective view of the appearance of a vibrating motor 15 according to an embodiment of the present invention. FIG. 2 is a sectional perspective view of the vibrating motor 15 taken along line A-A in FIG. 1. FIG. 3 is a sectional view of the vibrating motor 15 taken along line A-A in FIG. 1.

The vibrating motor 15 mainly includes a stationary portion 10, a vibrating body 7, and an elastic member 8. The stationary portion 10 includes a casing C1, a flexible print circuit (FPC) 3, a coil 4, a first yoke 5, and a second yoke 6.

The casing C1 includes a base plate 1 and a case 2. The base plate 1 is a plate member formed of, for example, a cold-rolled stainless steel plate. The base plate 1 extends in a direction perpendicular to the center axis J.

The case 2 is a cylindrical cover member including a lid 21 at an upper end. Specifically, the case 2 has an opening 22 at a lower end. The case 2 is made of, for example, stainless steel. The base plate 1 includes a substantially disk-shaped first base portion 11 and a substantially rectangular-plate-shaped second base portion 12, which are connected to each other. The case 2 is attached to the base plate 1 from above while having the opening 22 fitted to the first base portion 11. The case 2 is fixed to the base plate 1 by welding or fusing. The second base portion 12 is disposed outside the case 2. The casing C1 houses the FPC 3, the coil 4, the first yoke 5, the second yoke 6, the vibrating body 7, and the elastic member 8.

The FPC 3 is a substrate including a wiring for feeding electric current to the coil 4. The FPC 3 has a thickness in the vertical direction. The FPC 3 is flexible and fixed onto the base plate 1 by bonding or with an adhesive sheet. The FPC 3 includes a substantially disk-shaped first substrate portion 31, and a substantially rectangular-plate-shaped second substrate portion 32, which are connected to each other. The first substrate portion 31 is disposed on the first base portion 11. The first substrate portion 31 includes a first land portion L1 and a second land portion L2. The first land portion L1 and the second land portion L2 extend to form an arc in the circumferential direction on the outer side of the coil 4 in the radial direction and is exposed from the upper side. Lead wires drawn from the coil 4 are electrically connected to the first land portion L1 and the second land portion L2 by, for example, soldering.

The second substrate portion 32 is disposed on the second base portion 12. The second substrate portion 32 includes a first terminal portion T1 and a second terminal portion T2, which are exposed from the upper side. The first terminal portion T1 is connected to the first land portion L1 with a wire, and the second terminal portion T2 is connected to the second land portion L2 with a wire. In this structure, when a voltage is applied from the exterior to the first terminal portion T1 and the second terminal portion T2, electric current can be fed to the coil 4.

The FPC 3 is described later more specifically. Instead of the FPC 3, an inflexible rigid substrate may be used.

The first yoke (central yoke) 5 has, as a whole, a columnar shape extending in the vertical direction, and includes a base portion 51 and a protrusion 52. The first yoke 5 is made of, for example, free-cutting steel and is magnetic. The base portion 51 has a cylindrical shape extending in the vertical direction. The protrusion 52 has a cylindrical shape protruding downward from the base portion 51. The protrusion 52 has a smaller diameter than the base portion 51.

The first base portion 11 includes a fastening portion 111, protruding upward and having the center axis J as a center. The fastening portion 111 extends through the first substrate portion 31 of the FPC 3 in the vertical direction. The fastening portion 111 has a through hole 111A that extends through in the vertical direction. When the protrusion 52 is fitted into the through hole 111A and the base portion 51 is placed on the fastening portion 111, the first yoke 5 is fixed to the fastening portion 111. The first yoke 5 is fixed by press-fitting or caulking at the portion at which the protrusion 52 is fitted.

The coil 4 is formed by, for example, coiling a coil wire formed of a self-bonding polyurethane copper wire around the center axis J to extend in the vertical direction. A lower portion of the coil 4 is fitted to the outer side of the fastening portion 111 in the radial direction. The lower end surface of the coil 4 is fixed to the first substrate portion 31 by bonding or with an adhesive sheet. The coil 4 is disposed on the outer side of the first yoke 5 in the radial direction. The upper end surface of the coil 4 is aligned with the upper end surface of the base portion 51 in the vertical direction. Specifically, the upper end surfaces of the coil 4 and the base portion 51 form the same plane.

The second yoke (back yoke) 6 is formed of, for example, a cold-rolled stainless steel sheet, and is magnetic. The second yoke 6 includes a bottom portion 61 and a wall portion 62. The bottom portion 61 has a substantially disk shape having a thickness in the vertical direction. The bottom portion 61 is disposed in the plane the same as that formed by the upper end surfaces of the coil 4 and the base portion 51. The bottom portion 61 has a diameter larger than the outer diameter of the coil 4. Specifically, the bottom portion 61 expands to the outer side of the coil 4 in the radial direction from the center axis J at the center.

The wall portion 62 has a cylinder shape protruding downward from the outer edge of the bottom portion 61. Specifically, the inner peripheral surface of the wall portion 62 is located on the outer side of the outer peripheral surface of the coil 4 in the radial direction, and faces the outer peripheral surface in the radial direction. The undersurface of the bottom portion 61 is fixed to the upper end surface of the base portion 51 by bonding or with an adhesive sheet, so that the second yoke is fixed to the first yoke 5. In the state where electric current is not flowing through the coil, the middle of a magnet 71 in the vertical direction overlaps the wall portion 62. Compared to the structure where the middle of the magnet 71 in the vertical direction does not overlap the wall portion 62, the vibrating body 7 can be more quickly actuated to switch the displacement amount from zero to the peak at the start of the current supply to the coil 4. In other words, the vibrating motor 15 enhances its responsiveness at the start of the operation. For example, when electric current is not fed to the coil 4, the middle of the wall portion 62 in the vertical direction is substantially aligned with the middle of the magnet 71.

The vibrating body 7 includes the magnet 71, a weight 72, and a pole piece 73. The magnet 71 is formed of, for example, a sintered neodymium magnet, and has a cylindrical shape with a ring shape in a top plan view. The weight 72 is formed of, for example, a tungsten alloy, and has a substantially cylindrical shape with a ring shape in a top plan view. The magnet 71 is disposed on the inner side of the weight 72 in the radial direction. The outer peripheral surface of the magnet 71 and the inner peripheral surface of the weight 72 are fixed to each other by bonding or with an adhesive sheet. The pole piece 73 is, for example, a magnetic, disk-shaped member made of stainless steel. The pole piece 73 is disposed below the magnet 71 and fixed to the undersurface of the magnet 71 by bonding or with an adhesive sheet.

Figure 4:
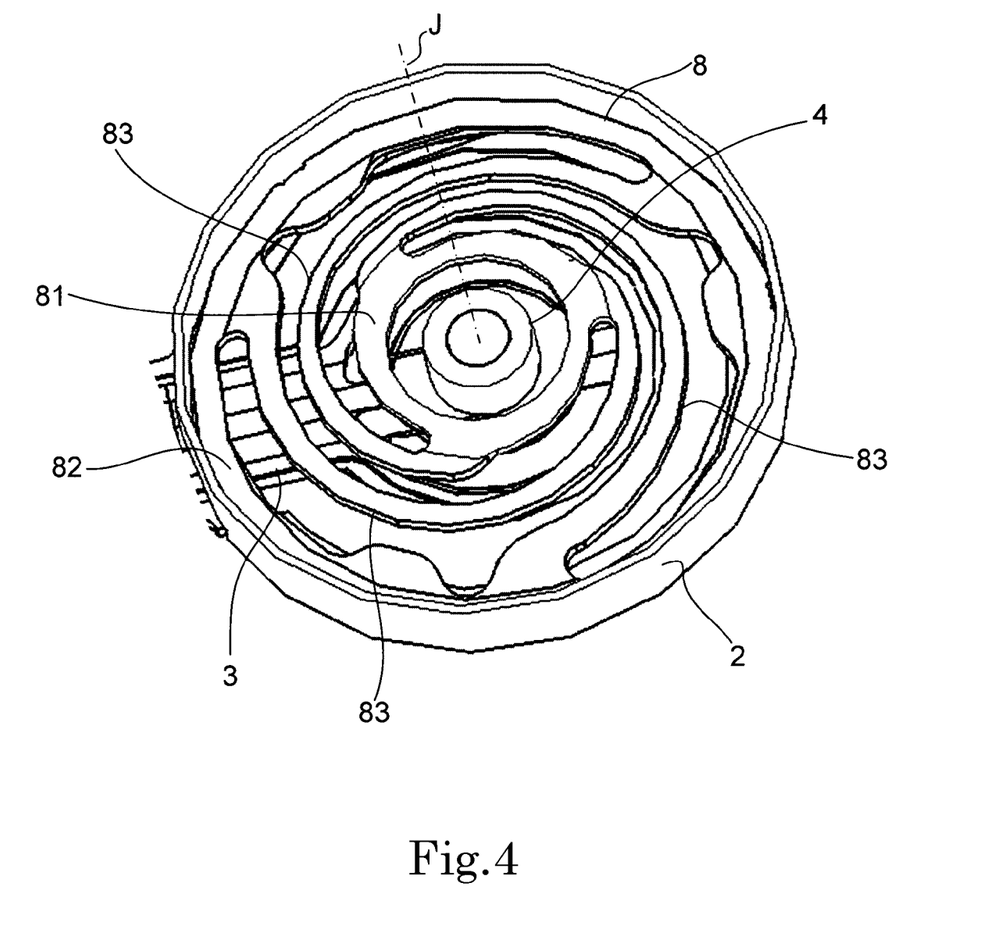
FIG. 4 is a partial sectional perspective of a lower portion of a vibrating motor.

The elastic member 8 is a flat spring member made of, for example, stainless steel. FIG. 4 is a partial sectional perspective view of a lower portion of the vibrating motor 15 taken to show the structure of the elastic member 8. The elastic member includes a first ring portion 81, a second ring portion 82 located lower than the first ring portion 81, and three connectors 83, which connect the first ring portion 81 and the second ring portion 82 to each other. The ring-shaped first ring portion 81 has three portions at the outer edge equidistantly arranged in the circumferential direction connected to the inner edge of the second ring portion 82 with the connectors 83 interposed therebetween. The connectors 83 extend outward in the radial direction and in the circumferential direction. The elastic member 8 having the above structure can expand and contract in the vertical direction.

The elastic member 8 is interposed between the vibrating body 7 and the first base portion 11. The coil 4 is disposed on the inner side of the first ring portion 81 in the radial direction. The undersurface of the second ring portion 82 is fixed to the upper surface of the first base portion 11 by welding or fusing, so that the elastic member 8 is fixed to the base plate 1. The upper surface of the first ring portion 81 is fixed to the undersurface of the pole piece 73 by welding or fusing, so that the elastic member 8 is fixed to the vibrating body 7.

Thus, the vibrating body 7 is supported by the elastic member 8 while being allowed to vibrate in the vertical direction. The inner peripheral surface of the magnet 71 is disposed on the outer side of the outer peripheral surface of the second yoke 6 in the radial direction, and faces the outer peripheral surface in the radial direction.

Supplying electric current to the coil 4 causes a magnetic flux that passes through a magnetic path constituted of the coil 4, the first yoke 5, and the second yoke 6. The magnetic flux thus caused and a magnetic flux that passes through a magnetic path constituted of the magnet 71 and the pole piece 73 interact with each other, so that the vibrating body 7 vibrates in the vertical direction. Thus, the vibrating motor 15 is a vibrating motor that linearly vibrates in the vertical direction.

The second yoke 6 includes the above-described bottom portion 61 and the wall portion 62. This structure reduces the distance between the second yoke 6 and the magnet 71 in the radial direction, and increases the distance in the vertical direction by the reduced distance. This structure can thus enhance power of the vibrating motor 15. The bottom portion 61 does not have to have a larger thickness. Thus, the size of the vibrating motor 15 in the vertical direction is prevented from being increased. The dimension of the coil 4 in the vertical direction does not need to be reduced. This structure prevents a reduction of the number of turns that can degrade the attraction force (reactance torque).

A thick yoke cannot be manufactured with inexpensive press working, and an expensive machined part is used instead. On the other hand, the second yoke 6 according to the embodiment does not need to have a large thickness, and thus can be manufactured with inexpensive press working.

The vibrating motor 15 also includes a magnetic fluid F1 disposed between the magnet 71 and the second yoke 6. The magnetic fluid F1 has a damper effect, with which the vibrating body 7 is prevented from being excessively moved when, for example, the vibrating motor 15 is dropped, so that the elastic member 8 is prevented from being broken.

Figure 5:
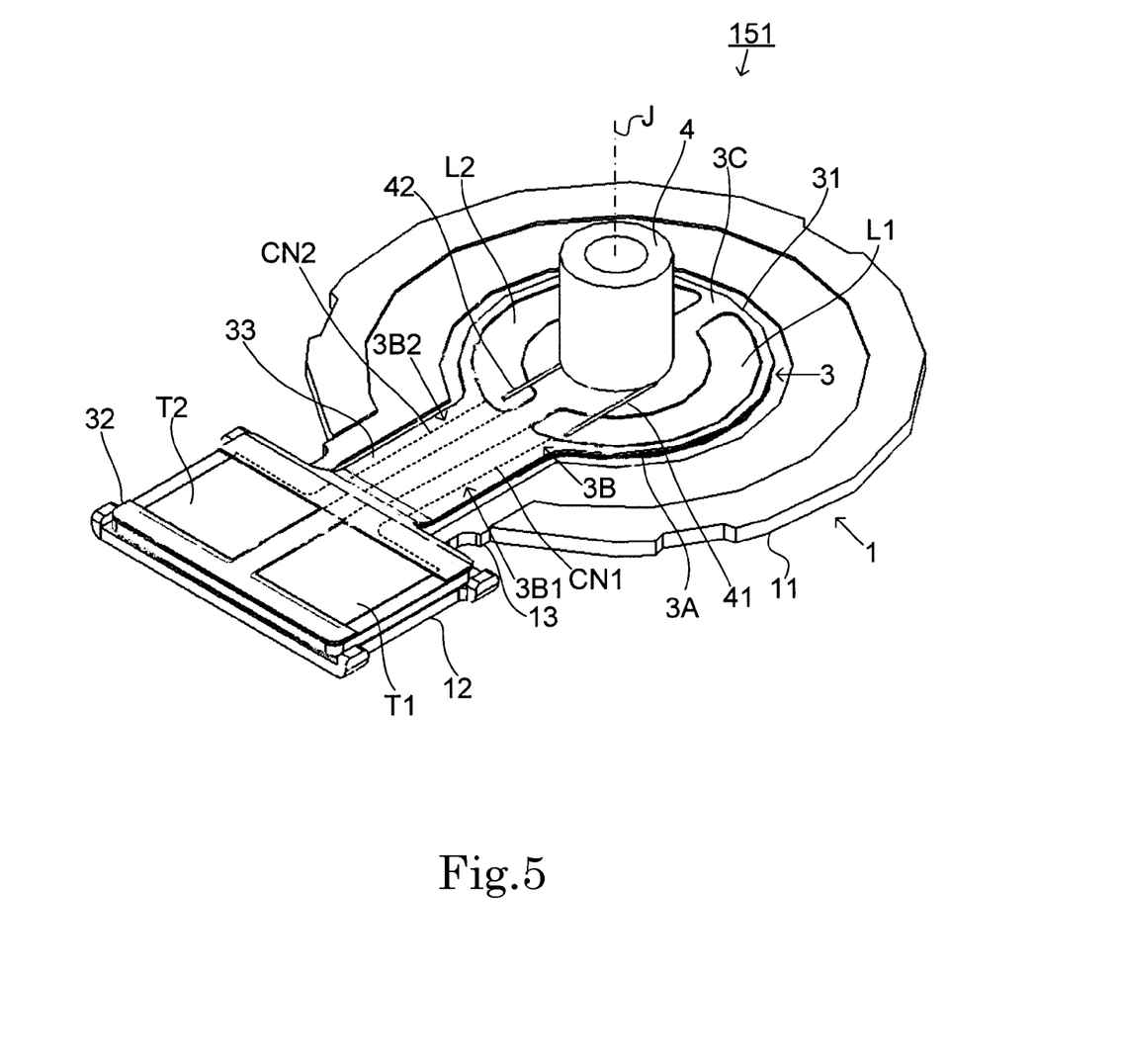
FIG. 5 is a perspective view of an example of a structure of a coil fixing structure.

Now, a coil fixing structure included in the vibrating motor 15 is described. FIG. 5 is a perspective view of a coil fixing structure 151 according to the embodiment.

The coil fixing structure 151 includes the FPC 3 and the coil 4 and is disposed on the base plate 1. The base plate 1 includes a first base portion 11, a second base portion 12, and a connector base portion 13. The connector base portion 13 connects the first base portion 11 to the second base portion 12 in the radial direction.

The FPC 3 includes a first substrate portion 31, a second substrate portion 32, and a connector substrate portion 33. The connector substrate portion 33 has a belt shape extending in the radial direction to connect the first substrate portion 31 to the second substrate portion 32 in the radial direction. The coil 4 is fixed onto the first substrate portion 31.

The FPC 3 includes a base film portion 3A, a conductor portion 3B, and an insulating portion 3C, which are laminated in the vertical direction in a multilayer structure. The base film portion 3A is made of, for example, polyimide, and insulative and flexible. The conductor portion 3B is made of, for example, a copper foil, and disposed on the base film portion 3A.

The conductor portion 3B includes a first wire portion 3B1 and a second wire portion 3B2. The first wire portion 3B1 and the second wire portion 3B2 are insulated from each other. The first wire portion 3B1 includes a first land portion L1, a first terminal portion T1, and a first connection wire portion CN1. The second wire portion 3B2 includes a second land portion L2, a second terminal portion T2, and a second connection wire portion CN2.

The insulating portion 3C is a photoresist layer disposed on the conductor portion 3B and formed of, for example, polyimide. The first land portion L1 and the second land portion L2 are included in the first substrate portion 31. The insulating portion 3C is not disposed above the first land portion L1 and the second land portion L2. Thus, the first land portion L1 and the second land portion L2 are exposed from the upper side to be electrically connectable to the exterior.

The insulating portion 3C is not disposed above the first terminal portion T1 and the second terminal portion T2. Thus, the first terminal portion T1 and the second terminal portion T2 are exposed from the upper side to be electrically connectable to the exterior. The first terminal portion T1 is connected to the first land portion L1 with the first connection wire portion CN1 interposed therebetween. The second terminal portion T2 is connected to the second land portion L2 with the second connection wire portion CN2 interposed therebetween. The insulating portion 3C is disposed above the first connection wire portion CN1 and the second connection wire portion CN2.

Figure 6:
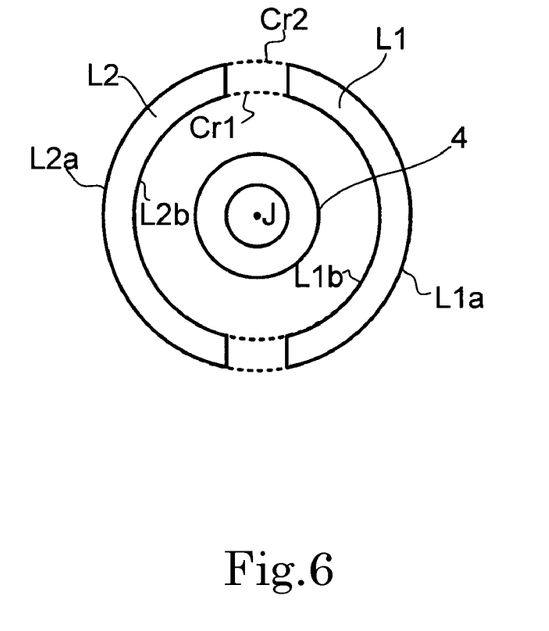
FIG. 6 is a schematic plan view of an example of a coil, a first land portion, and a second land portion, viewed from above.

FIG. 6 is a schematic plan view of the coil 4, the first land portion L1, and the second land portion L2, viewed from above. As illustrated in FIG. 6, the first land portion L1 includes an outer edge L1a, on an arc extending in the circumferential direction on the outer side of the coil 4 in the radial direction, and an inner edge L1b, on an arc extending in the circumferential direction on the outer side of the coil 4 in the radial direction. The first land portion L1 has an area defined by the outer edge L1a and the inner edge L1b. The second land portion L2 includes an outer edge L2a, on the arc extending in the circumferential direction on the outer side of the coil 4 in the radial direction, and an inner edge L2b, on the arc extending in the circumferential direction on the outer side of the coil 4 in the radial direction. The second land portion L2 has an area defined by an outer edge L2a and an inner edge L2b.

The outer edges L1a and L2a are disposed on a circle Cr2. The inner edges L1b and L2b are disposed on a circle Cr1, having a smaller diameter than the circle Cr2. The outer edges L1a and L2a and the inner edges L1b and L2b extend within the range of nearly 180 degrees in the circumferential direction. Thus, the first land portion L1 and the second land portion L2 are disposed to surround the coil 4 in a top plan view.

A first lead wire 41 drawn from the coil 4 has its end portion electrically connected to the first land portion L1. A second lead wire 42 drawn from the coil 4 has its end electrically connected to the second land portion L2. The second lead wire 42 is a coil proximal portion of the coil 4 and the first lead wire 41 is a coil distal portion of the coil 4. The first lead wire 41 and the second lead wire 42 are electrically connected to the respective land portions by soldering or resistance welding.

The first land portion L1 and the second land portion L2 having the above structures allow the first lead wire 41 and the second lead wire 42 drawn from the coil 4 to be electrically connected thereto without the position of the coil 4 being adjusted even when the positions at which the first lead wire 41 and the second lead wire 42 are drawn vary. This structure can thus maintain the efficiency of manufacturing the vibrating motor 15. The positioning of the coil 4 and the electrical connection of the lead wires may be performed manually or automatically by a device. The structure according to the present embodiment facilitates automation.

The outer edges L1a and L2a have the same length in the circumferential direction. The inner edges L1b and L2b have the same length in the circumferential direction. The first land portion L1 and the second land portion L2, respectively having large areas, can thus further allow for the variation of the positions at which the lead wires of the coil 4 are drawn. Alternatively, the two land portions may have different length in the circumferential direction. For example, the second land portion L2 may have a larger length in the circumferential direction than the first land portion L1.

As illustrated in FIG. 6, the circle Cr1, which includes the inner edge L1b of the first land portion L1 and the inner edge L2b of the second land portion L2, and the outer edge of the coil 4 are similar in shape.

Figure 7:
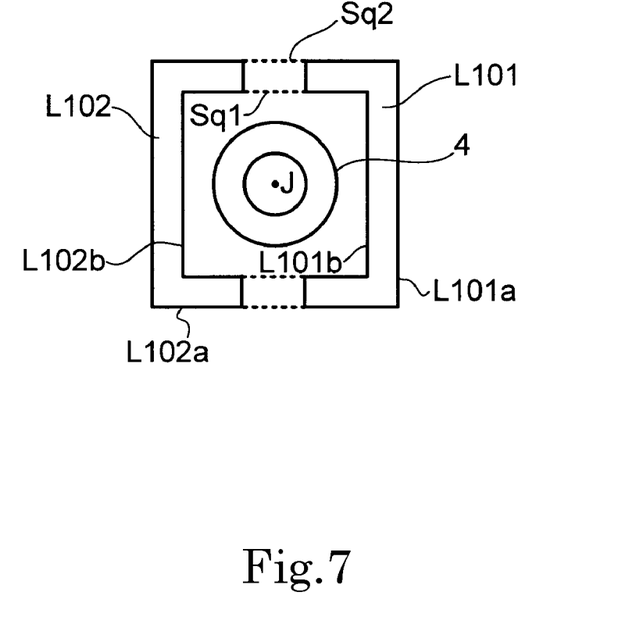
FIG. 7 is a schematic plan view of an example of a coil, a first land portion, and a second land portion, viewed from above.

In the present embodiment, the land portions may have shapes illustrated in FIG. 7. A first land portion L101 illustrated in FIG. 7 includes an outer edge L101a and an inner edge L101b. A second land portion L102 illustrated in FIG. 7 includes an outer edge L102a and an inner edge L102b. The inner edges L101b and L102b are disposed on a quadrangle Sq1. The outer edges L101a and L102a are disposed on a quadrangle Sq2.

In the structure illustrated in FIG. 7, the quadrangle Sq1, which includes the inner edges L101b and L102b, is not similar in shape to the outer edge of the coil 4. The distance from the outer edge of the coil 4 to each of the inner edges L101b and L102b thus varies, and the variation may prevent the lead wires from reaching the respective land portions, depending on the positions from which the lead wires are drawn from the coil 4. In the structure illustrated in FIG. 6, on the other hand, the circle Cr1 is similar in shape to the outer edge of the coil 4. Thus, the distance from the outer edge of the coil 4 to each of the inner edges L1b and L2b is uniform. Thus, the lead wires more reliably reach the land portions even when the positions from which the lead wires are drawn from the coil 4 vary.

The first land portion L1 and the second land portion L2 are exposed to the upper side and recessed. The undersurface of the coil 4 is fixed to the upper surface of the first substrate portion 31. If the undersurface is fixed to the upper surface by bonding with a bonding agent and the bonding agent spreads over the upper surface during bonding, the bonding agent flows into the first land portion L1 and the second land portion L2, and is thus prevented from spreading unnecessarily.

Figure 8:
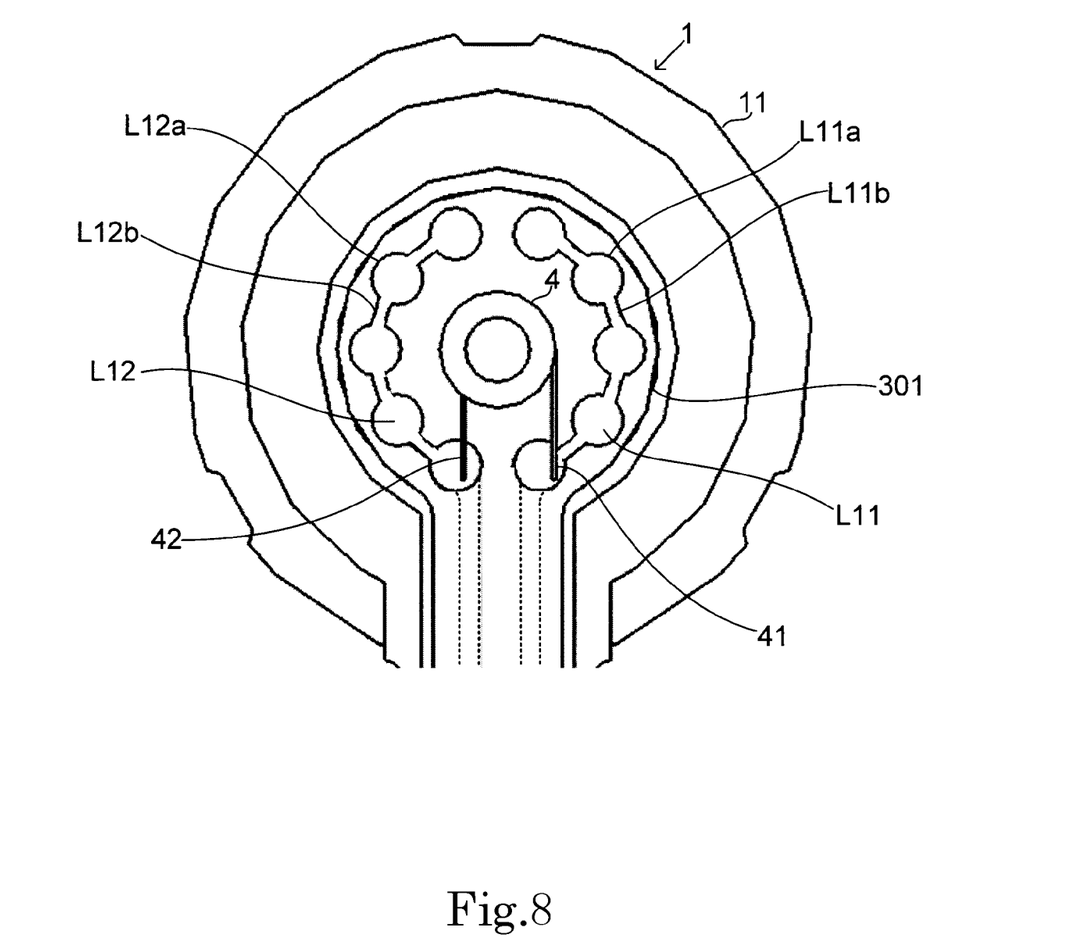
FIG. 8 is a partial plan view of a coil fixing structure according to a first modification example, viewed from above.

The coil fixing structure may have the following structure instead of the above structure. FIG. 8 is a partial plan view of a coil fixing structure according to a first modification example when viewed from above. The coil fixing structure according to the first modification example includes a FPC 301 and a coil 4. The FPC 301 includes a first land portion L11 and a second land portion L12. The first land portion L11 and the second land portion L12 are exposed from the upper side and recessed.

The first land portion L11 includes multiple sub-land portions L11a, which are arranged in the circumferential direction on the outer side of the coil 4 in the radial direction, and land connectors L11b. Each sub-land portion L11a is substantially circular when viewed from above. Each land connector L11b connects adjacent sub-land portions L11a to each other. The second land portion L12 includes multiple sub-land portions L12a, which are arranged in the circumferential direction on the outer side of the coil 4 in the radial direction, and land connectors L12b. Each sub-land portions L12a is substantially circular when viewed from above. Each land connector L12b connects adjacent sub-land portions L12a to each other.

The first lead wire 41 drawn from the coil 4 has its end portion electrically connected to one first land portion L11. The second lead wire 42 drawn from the coil 4 has its end portion electrically connected to one second land portion L12. Similarly to the above embodiment, the first land portion L11 and the second land portion L12 are arranged to surround the coil 4. This structure does not need position adjustment of the coil 4 even when the positions at which the lead wires are drawn vary. This structure can thus maintain the efficiency for manufacturing the vibrating motor.

Particularly, adjacent sub-land portions L11a are connected to each other by each land connector L11b, and adjacent sub-land portions L12a are connected to each other by each land connector L12b. In this structure, when the first lead wire 41 is soldered to one sub-land portion L11a to be electrically connected to the sub-land portion L11a, the solder is prevented from flowing into the adjacent sub-land portion L11a. In addition, when the second lead wire 42 is soldered to one sub-land portion L12a to be electrically connected to the sub-land portion L12a, the solder is prevented from flowing into the adjacent sub-land portion L12a. This structure prevents the solder from flowing unnecessarily during soldering and from hindering the soldering. An electric conductor used for electrical connection is not limited to solder.

Figure 9:
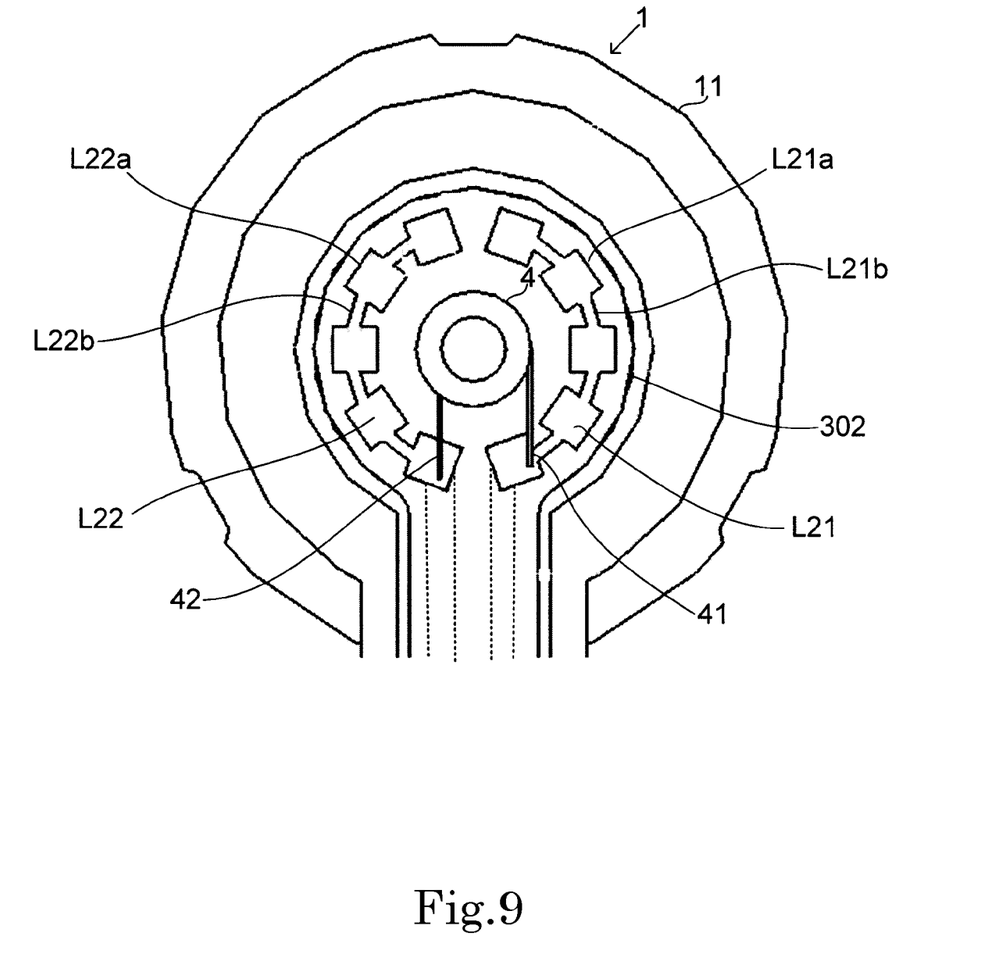
FIG. 9 is a partial plan view of a coil fixing structure according to a second modification example, viewed from above.

FIG. 9 is a partial plan view of a coil fixing structure according to a second modification example when viewed from above. The coil fixing structure according to the second modification example includes a FPC 302 and a coil 4. The FPC 302 includes a first land portion L21 and a second land portion L22. The first land portion L21 and the second land portion L22 are exposed from the upper side and recessed.

The first land portion L21 includes multiple sub-land portions L21a, which are arranged in the circumferential direction on the outer side of the coil 4 in the radial direction, and land connectors L21b. Each land connector L21b connects adjacent sub-land portions L21a to each other. The second land portion L22 includes multiple sub-land portions L22a, which are arranged in the circumferential direction on the outer side of the coil 4 in the radial direction, and land connectors L22b. Each land connector L22b connects adjacent sub-land portions L22a to each other.

The second modification example differs from the first modification example in that the sub-land portions L21a and the sub-land portion L22a are quadrangular. The second modification example has the effects similar to those of the first modification example.

Figure 10:
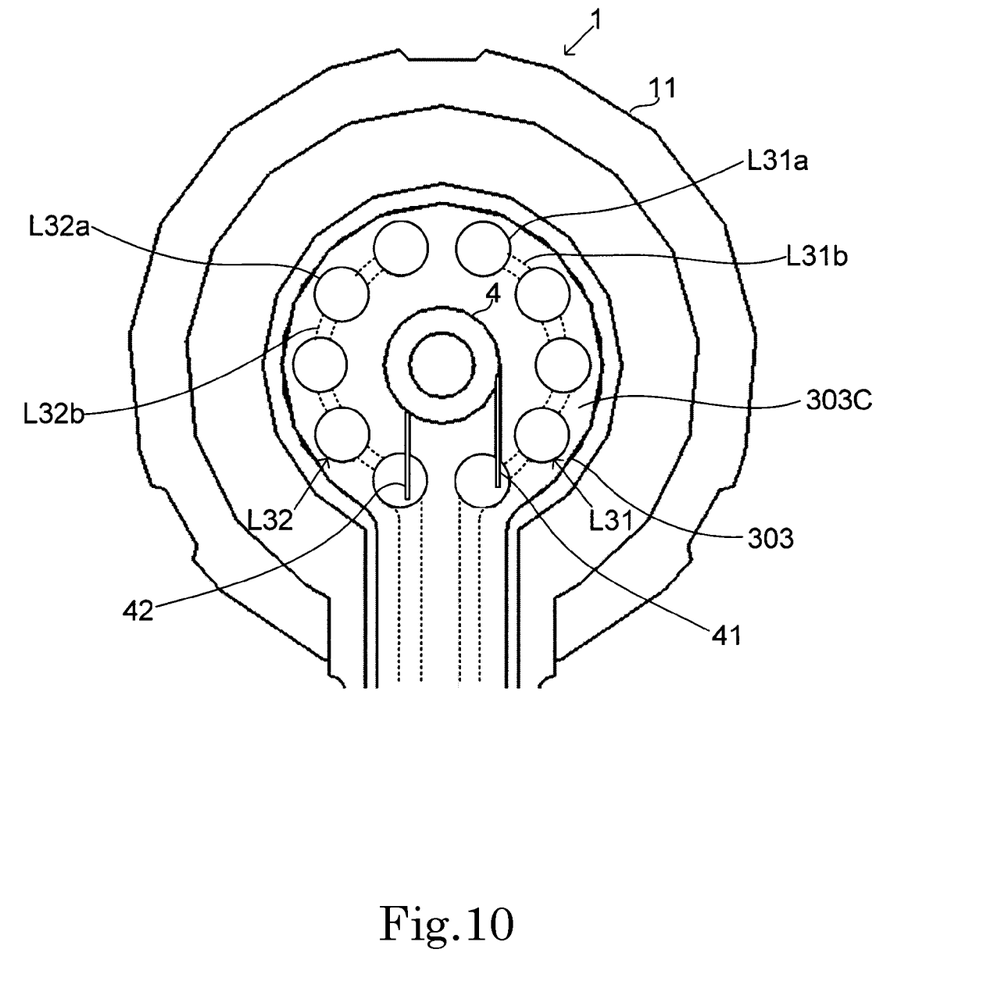
FIG. 10 is a partial plan view of a coil fixing structure according to a third modification example, viewed from above.

FIG. 10 is a partial plan view of a coil fixing structure according to a third modification example when viewed from above. The coil fixing structure according to the third modification example includes a FPC 303 and a coil 4. The FPC 303 includes a first land portion L31 and a second land portion L32. The first land portion L31 and the second land portion L32 are exposed from the upper side and recessed.

The first land portion L31 includes multiple sub-land portions L31a, which are arranged in the circumferential direction on the outer side of the coil 4 in the radial direction, and land connectors L31b. Each sub-land portion L31a is substantially circular when viewed from above. Each land connector L31b connects adjacent sub-land portions L31a to each other. An insulating portion 303C is disposed over the land connectors L31b. When viewed from above, the insulating portion 303C is disposed between adjacent sub-land portions L31a. In other words, the land connectors L31b are not exposed from the upper side.

The second land portion L32 includes multiple sub-land portions L32a, which are arranged in the circumferential direction on the outer side of the coil 4 in the radial direction, and land connectors L32b. The sub-land portions L32a are substantially circular when viewed from above. Each land connector L32b connects adjacent sub-land portions L32a to each other. The insulating portion 303C is disposed over the land connectors L32b. When viewed from above, the insulating portion 303C is disposed between adjacent sub-land portions L32a. In other words, the land connectors L32b are not exposed from the upper side.

The first lead wire 41 drawn from the coil 4 has its end portion electrically connected to the first land portion L31, and the second lead wire 42 drawn from the coil 4 has its end portion electrically connected to the second land portion L32. Similarly to the above-described embodiment, the first land portion L31 and the second land portion L32 are disposed to surround the coil 4. This structure does not need position adjustment of the coil 4 even when the positions at which the lead wires are drawn vary. This structure can thus maintain the efficiency for manufacturing the vibrating motor.

Particularly, the insulating portion 303C is disposed between adjacent sub-land portions L31a when viewed from above. In this structure, when the first lead wire 41 is soldered to one sub-land portion L31a to be electrically connected to the sub-land portion L31a, the solder is prevented from flowing out of the soldered sub-land portion L31a. Similarly, when viewed from above, the insulating portion 303C is disposed between adjacent sub-land portions L32a. In this structure, when the second lead wire 42 is soldered to one sub-land portion L32a to be electrically connected to the sub-land portion L32a, the solder is prevented from flowing out of the soldered sub-land portion L32a. This structure improves work efficiency of soldering.

Figure 11:
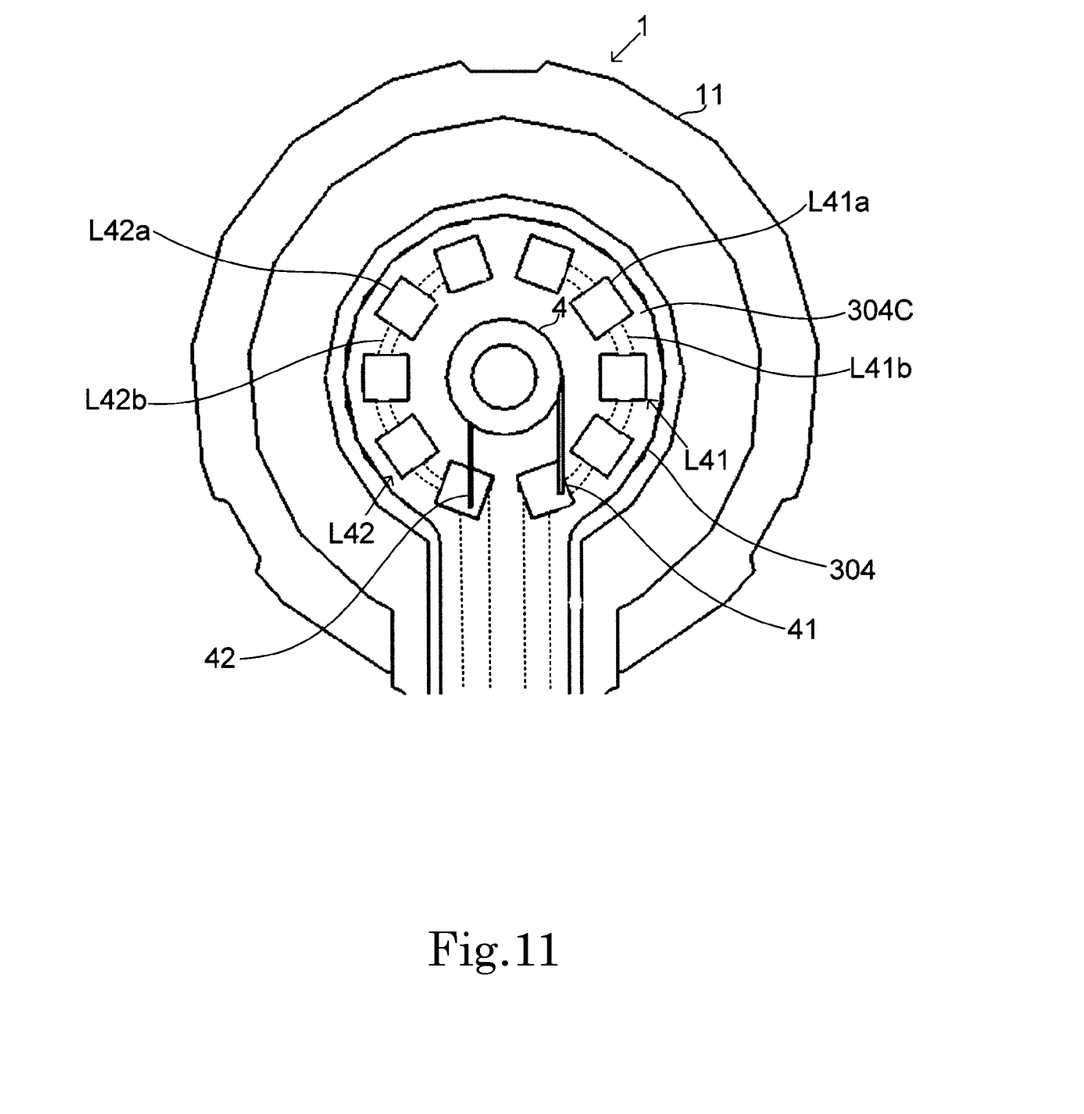
FIG. 11 is a partial plan view of a coil fixing structure according to a fourth modification example, viewed from above.

FIG. 11 is a partial plan view of the coil fixing structure according to a fourth modification example when viewed from above. The coil fixing structure according to the fourth modification example includes a FPC 304 and a coil 4. The FPC 304 includes a first land portion L41 and a second land portion L42. The first land portion L41 and the second land portion L42 are exposed from the upper side and recessed.

The first land portion L41 includes multiple sub-land portions L41a, arranged in the circumferential direction on the outer side of the coil 4 in the radial direction, and land connectors L41b. Each land connector L41b connects adjacent sub-land portions L41a to each other. An insulating portion 304C is disposed over the land connectors L41b. Thus, when viewed from above, the insulating portion 304C is disposed between adjacent sub-land portions L41a. Specifically, the land connectors L41b are not exposed from the upper side.

The second land portion L42 includes multiple sub-land portions L42a, which are arranged in the circumferential direction on the outer side of the coil 4 in the radial direction, and land connectors L42b. Each land connector L42b connects adjacent sub-land portions 42a to each other. The insulating portion 304C is disposed over the land connectors L42b. Thus, when viewed from above, the insulating portion 304C is disposed between adjacent sub-land portions L42a. Specifically, the land connectors L42b are not exposed from the upper side.

The fourth modification example differs from the third modification example in that the sub-land portions L41a and sub-land portions L42a are quadrangular. The fourth modification example has the effects similar to those of the third modification example.

The coil fixing structure according to the embodiment includes the substrate 3, which has a thickness in a vertical direction, and a coil 4, which is wound around the axis J extending in the vertical direction and fixed to the substrate 3. The substrate 3 includes the conductor portion 3B, and the insulating portion 3C disposed on the conductor portion 3B. The conductor portion 3B includes the first land portion L1 and the second land portion L2, which are exposed from an upper surface of the substrate 3. The first lead wire 41 drawn from the coil 4 has its end portion connected to the first land portion L1. The second lead wire 42 drawn from the coil 4 has its end portion connected to the second land portion L2. When viewed in a plan in the vertical direction, the first land portion L1 and the second land portion L2 are disposed to surround the coil 4.

In this structure, the lead wires drawn from the coil can be connected to the first land portion and the second land portion without position adjustment of the coil even when the positions at which the lead wires are drawn from the coil vary. This structure can thus maintain the manufacturing efficiency.

In the above structure, the coil 4 is fixed to the substrate 3 with a bonding agent. Even when the bonding agent spreads over the substrate while the coil is bonded to the substrate, the bonding agent flows into the recessed first and second land portions and is thus prevented from spreading unnecessarily.

In the above structure, the first land portion L1 and the second land portion L2 have substantially the same length in the circumferential direction around the axis J. In this structure, the first land portion L1 and the second land portion L2 have wide areas, and thus further allow for the variation of the positions at which the lead wires are drawn.

In the above structure, when viewed in a plan in the vertical direction, the circle Cr1 including the inner edge L1b of the first land portion L1 and the inner edge L2b of the second land portion L2 is similar in shape to the outer edge of the coil 4. Thus, the distance from the outer edge of the coil to the inner edge of each land portion is substantially uniform. This structure prevents the lead wires from failing to reach and to be connected to the land portions.

In the above structure, the first land portion L11 and the second land portion L12 respectively include multiple sub-land portions L11a and L12a, which are arranged in the circumferential direction around the axis J, and connectors L11b and L12b, which each connect adjacent two of the sub-land portions L11a or L12a to each other. When the lead wires are connected to the sub-land portions by, for example, soldering, this structure prevents the solder and the like from flowing into adjacent sub-land portions.

In the above structure, the first land portion L31 and the second land portion L32 respectively include multiple sub-land portions L31a and L32a, which are arranged in the circumferential direction around the axis J.

When viewed in a plan in the vertical direction, the insulating portion 303C is disposed between adjacent sub-land portions L31a or L32a. When the lead wires are connected to the sub-land portions by, for example, soldering, this structure prevents the solder and the like from flowing out of the sub-land portions soldered or undergoing other operations.

The embodiments of the present invention have been described thus far. The embodiments, however, can be modified in various manners within the range of the gist of the present invention.

For example, the coil fixing structure according to any of the embodiments may be installed in a motor other than a vibrating motor, or in an electric circuit including a coil as a circuit element.

The present invention is applicable to, for example, a vibrating motor.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil fixing structure comprising:
   a substrate, which has a thickness in a vertical direction; and
   a coil, which is wound around an axis extending in a vertical direction and fixed to the substrate,
   wherein the substrate includes a conductor portion and an insulating portion disposed on the conductor portion,
   wherein the conductor portion includes a first land portion and a second land portion, which are exposed from an upper surface of the substrate,
   wherein a first lead wire drawn from the coil has an end portion connected to the first land portion,
   wherein a second lead wire drawn from the coil has an end portion connected to the second land portion, and
   wherein, when viewed in a plan in the vertical direction, the first land portion and the second land portion are disposed to surround the coil.

2. The coil fixing structure according to claim 1, wherein the coil is bonded to the substrate with a bonding agent.

3. The coil fixing structure according to claim 2, wherein the first land portion and the second land portion have substantially equal lengths in a circumferential direction around the axis.

4. The coil fixing structure according to claim 3 wherein, when viewed in a plan in the vertical direction, a shape including an inner edge of the first land portion and an inner edge of the second land portion is similar in shape to an outer edge of the coil.

5. The coil fixing structure according to claim 4,
   wherein the first land portion and the second land portion each include
   a plurality of sub-land portions arranged in the circumferential direction around the axis, and
   at least one connector connecting adjacent two of the sub-land portions.

6. The coil fixing structure according to claim 4,
   wherein the first land portion and the second land portion each include a plurality of sub-land portions arranged in the circumferential direction around the axis, and
   wherein, when viewed in a plan in the vertical direction, the insulating portion is disposed between adjacent two of the sub-land portions.

* * * * *